(12) United States Patent
Pandey et al.

(10) Patent No.: US 10,096,551 B2
(45) Date of Patent: Oct. 9, 2018

(54) ELECTRONIC COMPONENT OF INTEGRATED CIRCUITRY AND A METHOD OF FORMING A CONDUCTIVE VIA TO A REGION OF SEMICONDUCTOR MATERIAL

(71) Applicant: Micron Technology, Inc., Boise, ID (US)

(72) Inventors: Deepak Chandra Pandey, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/668,053

(22) Filed: Aug. 3, 2017

(65) Prior Publication Data

US 2017/0358532 A1    Dec. 14, 2017

Related U.S. Application Data

(62) Division of application No. 14/975,746, filed on Dec. 19, 2015, now Pat. No. 9,754,889.

(51) Int. Cl.
| | |
|---|---|
| H01L 23/48 | (2006.01) |
| H01L 23/52 | (2006.01) |
| H01L 29/40 | (2006.01) |
| H01L 23/535 | (2006.01) |
| H01L 21/768 | (2006.01) |
| H01L 23/528 | (2006.01) |
| H01L 29/417 | (2006.01) |
| H01L 49/02 | (2006.01) |
| H01L 21/74 | (2006.01) |
| H01L 29/423 | (2006.01) |

(52) U.S. Cl.
CPC .......... *H01L 23/535* (2013.01); *H01L 21/743* (2013.01); *H01L 21/76816* (2013.01); *H01L 21/76895* (2013.01); *H01L 23/5283* (2013.01); *H01L 28/00* (2013.01); *H01L 29/41766* (2013.01); *H01L 29/4236* (2013.01)

(58) Field of Classification Search
CPC .............. H01L 23/535; H01L 23/5283; H01L 21/76895; H01L 21/76816
See application file for complete search history.

(56) References Cited

U.S. PATENT DOCUMENTS

| | | | | |
|---|---|---|---|---|
| 2004/0046251 A1* | 3/2004 | Lee | ................... | H01L 21/76805 257/734 |
| 2005/0139952 A1* | 6/2005 | Koh | ................... | H01L 21/76227 257/510 |
| 2014/0151852 A1* | 6/2014 | Adkisson | .......... | H01L 29/66242 257/565 |
| 2015/0228793 A1* | 8/2015 | Chen | ................... | H01L 29/7851 257/401 |
| 2016/0027727 A1* | 1/2016 | Kim | ..................... | H01L 21/764 257/774 |

* cited by examiner

*Primary Examiner* — Victor A Mandala
(74) *Attorney, Agent, or Firm* — Wells St. John P.S.

(57) ABSTRACT

An electronic component of integrated circuitry comprises a substrate comprising at least two terminals. Material of one of the terminals has an upper surface. A conductive via extends elevationally into the material of the one terminal. The conductive via extends laterally into the material of the one terminal under the upper surface of the one terminal. Material of the one terminal is above at least some of the laterally extending conductive via. Other embodiments, including method embodiments, are disclosed.

15 Claims, 11 Drawing Sheets

ELECTRONIC COMPONENT OF INTEGRATED CIRCUITRY AND A METHOD OF FORMING A CONDUCTIVE VIA TO A REGION OF SEMICONDUCTOR MATERIAL

RELATED PATENT DATA

This patent resulted from a divisional application of U.S. patent application Ser. No. 14/975,746, filed Dec. 19, 2015, entitled "Electronic Component Of Integrated Circuitry And A Method Of Forming A Conductive Via To A Region Of Semiconductor Material", naming Deepak Chandra Pandey and Haitao Liu as inventors, the disclosure of which is incorporated by reference.

TECHNICAL FIELD

Embodiments disclosed herein pertain to electronic components of integrated circuitry and to methods of forming a conductive via to a region of semiconductor material.

BACKGROUND

Embodiments of the invention were motivated in addressing trade-offs in attaining high device on-current ($I_{on}$) at the expense of undesired current leakage in recessed access devices.

A recessed access device is a field effect transistor having its gate construction buried within a trench formed in semiconductive material. The gate construction includes a gate insulator which lines the trench and conductive gate material within the trench laterally inward of the gate insulator. A source/drain region is formed in outermost regions of the semiconductive material on each of opposing sides of the trench. When the two source/drain regions are at different voltages and a suitable voltage is applied to the conductive gate material, current ($I_{on}$) flows through the semiconductive material between the source/drain regions along the trench sidewalls and around the base of the trench (i.e., a conductive channel forms through which current flows between the two source/drain regions). Voltage of the source/drain regions is typically controlled through a respective conductive via that makes electrically coupling contact with the respective source/drain region. To minimize contact resistance, the elevationally outermost portions of the source/drain regions may be provided with a high conductivity dopant implant, for example phosphorus (for n-type) implanted at 1 to 8 keV at a dose of $1 \times 10^{14}$ atoms/cm$^2$ to $4 \times 10^{14}$ atoms/cm$^2$ to provide a conductivity-increasing implant of greater than $1 \times 10^{20}$ atoms/cm$^3$. This renders the elevationally outermost portion of the source/drain region highly conductive, thereby reducing contact resistance but at the expense of increasing gate induced drain leakage (GIDL) or off current ($I_{off}$). GIDL is a negative attribute associated with field effect transistors and can be problematic with recessed access devices or other devices or applications where leakage is a concern. For example, DRAM access devices can suffer from charge leakage due to increase in GIDL. High dose implants can increase $I_{on}$ but also can increase GIDL.

As device dimensions shrink in the ever-continuing goal of fabricating denser integrated circuitry, the available area for conductive contact of vias shrinks. This raises both contact resistance and contact-via resistance. Further where the via is made of conductively doped polysilicon, dopant diffusion from that via during subsequent thermal cycles raises GIDL.

While the invention was motivated in addressing the above issues, it is not so limited.

DETAILED DESCRIPTION OF EXAMPLE EMBODIMENTS

Embodiments of the invention encompass an electronic component of integrated circuitry. In one embodiment the component is a field effect transistor and in one such embodiment is a recessed access device. Embodiments of the invention encompass other electronic components whether existing or yet-to-be developed.

Some embodiments of the invention are initially described with reference to FIG. 1, which shows a substrate fragment 10 comprising a base substrate 12 which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Base substrate 12 may comprise any one or more of conductive (i.e., electrically herein), semi-conductive, or insulative/insulator (i.e., electrically herein) material(s). Example substrate 12 comprises semiconductor material 14, for example suitably doped monocrystalline silicon, polysilicon, sapphire, or silicon-germanium, having trench isolation regions 16 formed therein. Any of the materials, regions, and structures described herein may be homogenous or non-homogenous, and regardless may be continuous or discontinuous over any material which such overlie. Further, unless otherwise stated, each material may be formed using any suitable or yet-to-be developed technique, with atomic layer deposition, chemical vapor deposition, physical vapor deposition, epitaxial growth, diffusion doping, and ion implanting being examples. Example trench isolation material is silicon dioxide which may be lined with silicon nitride. Additionally and or alternately, conductive isolation structures might be within trench isolation regions 16.

Figure 1:
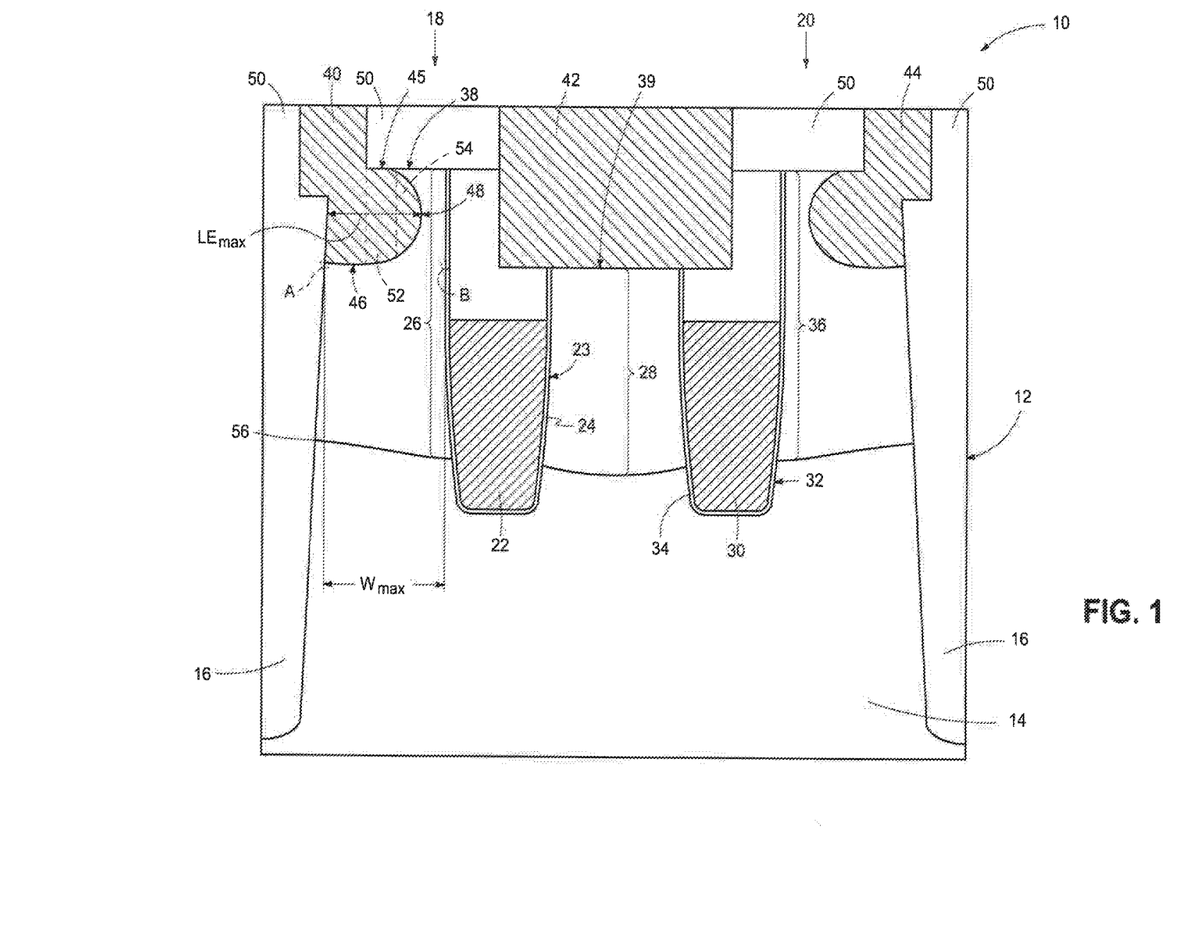
FIG. 1 is a diagrammatic sectional view of a vertical cross-section of a substrate fragment comprising an electronic component of integrated circuitry in accordance with an embodiment of the invention.

FIG. 1 shows two electronic components 18 and 20 of integrated circuitry in accordance with an embodiment of the invention. Such are shown as having been fabricated relative to example substrate 12, although other substrates may be used. Further, each is shown as being in the form of a field effect transistor, and more specifically in one embodiment as a recessed access device. Components 18 and 20 in the depicted example are mirror images of one another and share a source/drain region/terminal as described below, although such is of course not required. Regardless, an electronic component of integrated circuitry in accordance with an embodiment of the invention comprises a substrate (e.g., substrate 12) comprising at least two terminals. Electronic component 18 comprises at least three terminals in the form of a conductive gate 22 in a trench 23 in semiconductor material 14 and a pair of source/drain regions 26 and 28 in elevationally outer portions of semiconductor material 14 on opposing sides of trench 23 (the three terminals being parts 22, 26, and 28). In this document, "elevational", "upper", "lower", "top", "bottom", "above, "below", "under" and "beneath" are generally with reference to the vertical direction. "Horizontal" refers to a general direction (i.e., within 10 degrees) along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

Any suitable conductive material(s) may be used for conductive gate 22, with elemental metals, an alloy of two or more elemental metals, conductive metal compounds, and conductively doped semiconductive materials being examples. A gate insulator 24 is along sidewalls and a base of trench 23 between conductive gate 22 and semiconductor material 14. Elevationally outer portions of source/drain regions 26 and 28 may be suitably doped with conductivity enhancing impurities to be electrically conductive (e.g., peak p-type or n-type doing of at least $1\times10^{20}$ atoms/cm$^3$). Elevationally inner portions of source/drain regions 26 and 28 may include lower concentration impurity modifying dopant concentration regions, for example an LDD region and/or a halo region (not specifically shown).

Electronic component 20 also comprises a three-terminal recessed access device comprising a conductive gate 30 in a trench 32 in semiconductor material 14 and a pair of source/drain regions 28 and 36 in elevationally outer portions of semiconductor material 14 on opposing sides of trench 32 (the three terminals being parts 30, 36, and 28). Accordingly in this example embodiment, electronic components 18 and 20 share one terminal in the form of source/drain region 28. A gate insulator 34 is along sidewalls and a base of trench 32 between conductive gate 30 and semiconductor material 14. The discussion largely proceeds solely with reference to electronic component 18 for ease of description, with electronic component 20 in the example FIG. 1 embodiment having the same features although in mirror-image in the vertical cross-section depicted by FIG. 1.

Material of source/drain region 26 (e.g., terminal 26) has an upper surface 38, and which in one embodiment is the elevationally outermost surface of material of terminal 26. Material of source/drain region 28 (e.g., terminal 28) has an upper surface 39 which in one embodiment is the elevationally outermost surface of material of terminal 28. A conductive via 40 extends elevationally into material of source/drain terminal 26 and electrically couples therewith. In this document, devices/materials/components are "electrically coupled" relative one another if in normal operation electric current is capable of continuously flowing from one to the other, and does so predominately by movement of subatomic positive and/or negative charges when such are sufficiently generated. Conductive via 40 may comprise any suitable conductive material, for example such as those described above for gates 22 and 30, and in one embodiment comprises conductively doped polysilicon. Conductive via 40 also extends laterally into material of source/drain terminal 26 under upper surface 38 of source/drain terminal 26. Material of source/drain terminal 26 is above at last some of the laterally extending portion of conductive via 10. Conductive via 40 has a bottom 46 (i.e., an elevationally innermost surface) that is ideally elevationally outward of the top of gate material 22. Another of the at least two terminals of the electronic component may alternately or also have such a conductive via, although such is not shown with respect to recessed access device 18. Rather, recessed access device 18 comprises a different construction conductive via 42 which electrically couples with upper surface 39 of source/drain terminal 28. Recessed access device 20 comprises a conductive via 44 which in the depicted example is mirror-image in construction to that of conductive via 40.

Source/drain terminal 26 has a maximum horizontal width $W_{max}$ in vertical cross-section adjacent bottom 46 of conductive via 40 (e.g., length of a horizontal line from where bottom 46 meets trench isolation region 16 within circle A to where source/drain terminal 26 meets gate insulator 24 within circle B). In one embodiment, conductive via 40 in the vertical cross-section has a maximum lateral extent $LE_{max}$ in the material of terminal 26 that is at least 30% of such maximum horizontal width $W_{max}$, in one embodiment at least 50% of $W_{max}$, and in one embodiment at least 75% of $W_{max}$. In one embodiment, the maximum lateral extent $LE_{max}$ is less than 100% of such maximum horizontal width $W_{max}$. FIG. 1 depicts an example embodiment wherein $LE_{max}$ is both at least 75% of $W_{max}$ and less than 100% of $W_{max}$. In one embodiment and as shown, conductive via 40 has a laterally innermost surface 48 laterally into material of terminal 26, with such surface 48 being curved and convex.

In one embodiment, electronic component 18 comprises insulator material 50 that is above and directly against upper surface 38 of terminal 26, with conductive via 40 extending elevationally through insulator material 50 and laterally under insulator material 50 that is directly against upper surface 38. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s)

result(s) in no physical touching contact of the stated materials, regions, or structures relative one another. Any suitable insulator material may be used, with silicon dioxide and silicon nitride being examples. In one such embodiment and as shown, a lateral portion 52 of the conductive via that is laterally under insulator material 50 has an elevationally outermost surface 45 that is directly against an underside surface of the insulator material. In one embodiment, another lateral portion 54 of the conductive material of via 40 that is laterally under insulator material 50 has no elevationally outermost surface thereof that is directly against any underside surface of insulator material 50. In one embodiment, terminal 26 has a laterally outermost edge 56 in vertical cross-section, with conductive via 40 extending laterally outward beyond outermost edge 56 of terminal 26 in the vertical cross-section.

Materials may be aside, elevationally inward, or elevationally outward of the FIG. 1—depicted materials. For example, other partially or wholly fabricated components of integrated circuitry may be provided somewhere above, about, or within substrate fragment 10.

Figure 2:
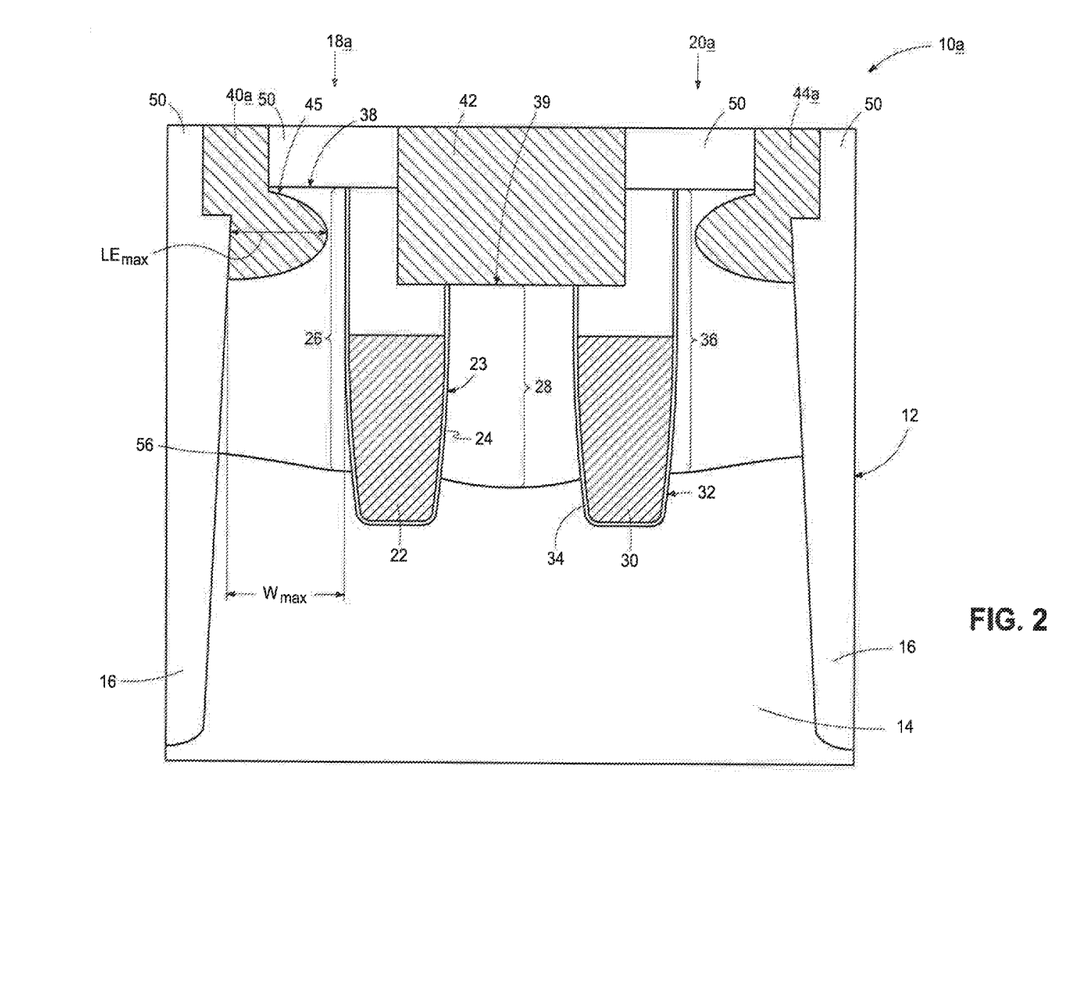
FIG. 2 is a diagrammatic sectional view of a vertical cross-section of a substrate fragment comprising an electronic component of integrated circuitry in accordance with an alternate embodiment the invention.

An alternate embodiment electronic component of integrated circuitry is shown and described with reference to FIG. 2. Like numerals from the above-described embodiments have been used where appropriate, with some construction differences being indicated with the suffix "a". FIG. 2 shows a substrate fragment 10a comprising electronic component 18a having a conductive via 40a. None of conductive via 40a that is laterally under insulator material 50 is directly against any underside surface of insulator material 50. Any other attribute(s) or aspect(s) as shown and/or described above with respect to FIG. 1 may be used in the embodiments of FIG. 2.

Figure 3:
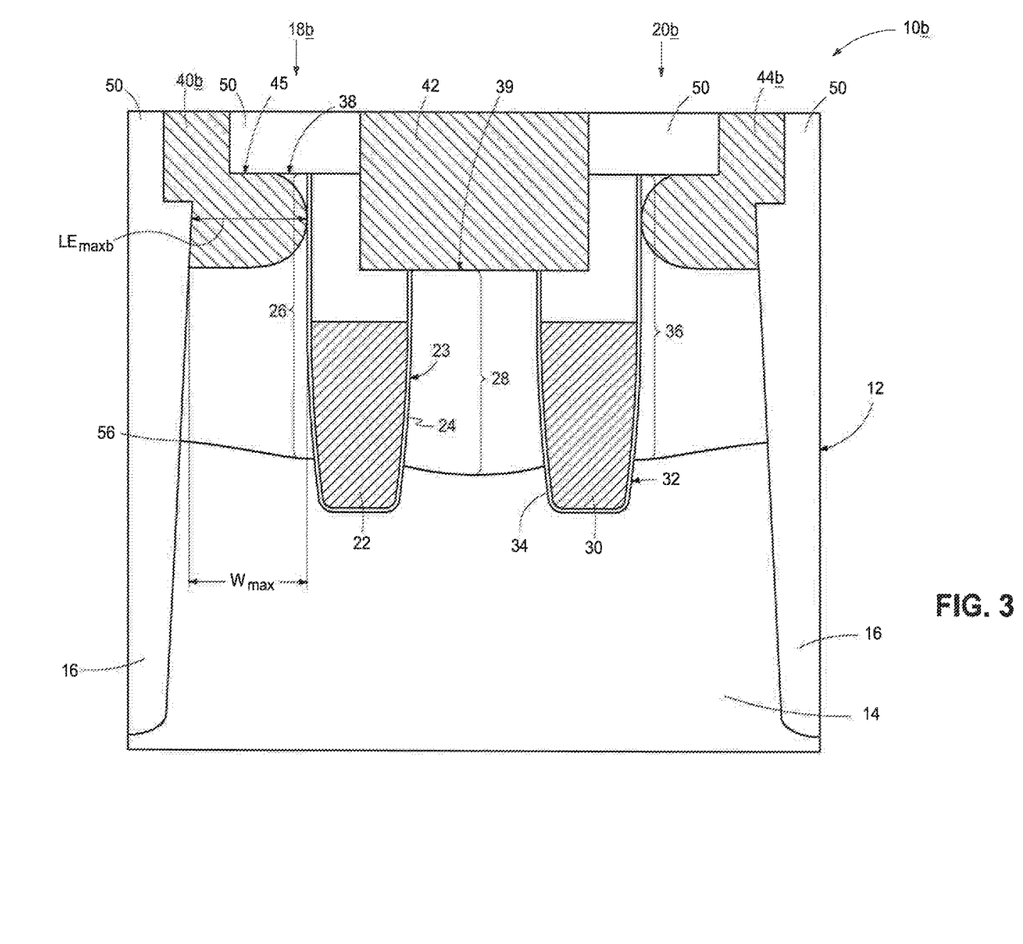
FIG. 3 is a diagrammatic sectional view of a vertical cross-section of a substrate fragment comprising an electronic component of integrated circuitry in accordance with an alternate embodiment the invention.

Another alternate embodiment electronic component is shown and described with reference to FIG. 3. Like numerals from the above-described embodiments have been used where appropriate with some construction differences being indicated with the suffix "b". Substrate fragment 10b comprises an electronic component 18b comprising a conductive via 40b. Conductive via 40b in the vertical cross-section has a maximum lateral extent $LE_{maxb}$ in material of terminal 26 that is 100% of maximum horizontal width $W_{max}$. Any other attribute(s) or aspect(s) as shown and/or described above with respect to FIGS. 1 and 2 may be used in the embodiments of FIG. 3.

Figure 4:
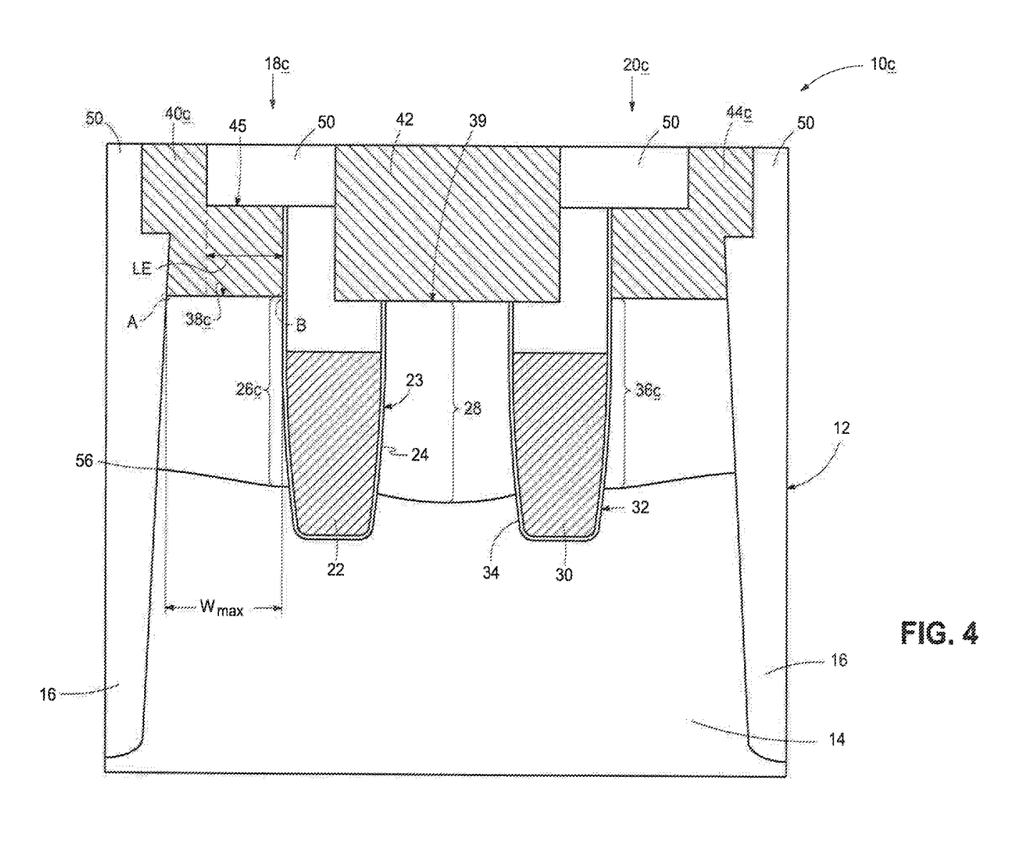
FIG. 4 is a diagrammatic sectional view of a vertical cross-section of a substrate fragment comprising an electronic component of integrated circuitry in accordance with an alternate embodiment the invention.

An alternate embodiment electronic component of integrated circuitry is shown and described with reference to FIG. 4 with respect to a substrate fragment 10c comprising an electronic component 18c. A conductive via 40c extends elevationally through insulator material 50 and extends laterally under and directly against an underside surface of insulator material 50 in the depicted vertical cross-section. Via 40c also extends elevationally over and directly against elevationally outermost surface 38c of source/drain terminal 26c in the vertical cross-section. All of lateral extent LE of conductive via 40c that is laterally under insulator material 50 has elevationally outermost surface 45 that is directly against the underside surface of insulator material 50. Any other attribute(s) or aspect(s) as shown and/or described above with respect to FIGS. 1-3 may be used in the embodiments of FIG. 4.

Figure 5:
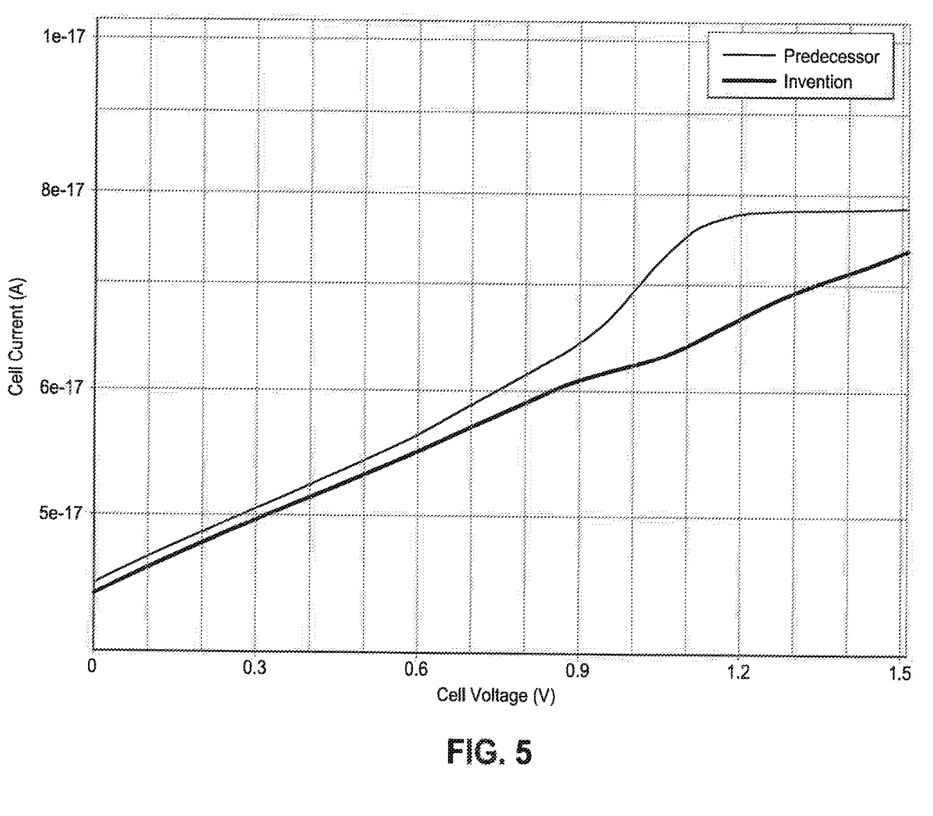
FIG. 5 is a graph comparing operational characteristics of an electronic component in accordance with the invention and a predecessor (non-invention) electronic component.

Electronic components in accordance with the invention may achieve improved operating characteristics in comparison to predecessor constructions. Consider, for example, an inventive construction of FIG. 1 having $W_{max}$ equal to 20 nanometers and $LE_{max}$ equal to 18 nanometers. Also consider a predecessor structure not in accordance with the invention having the same $W_{max}$ and all other identical construction but where none of the conductive via extends laterally under dielectric material 50 that is directly against elevationally outermost surface 38 of source/drain terminal 26 and none of the conductive via extends laterally under any elevationally outermost surface 38 of source/drain terminal 26. FIG. 5 is a graph showing current junction leakage (GIDL) as a function of cell voltage (gate 22 voltage) where voltage differential between terminals 26 and 28 was 1.5 volts. Such a construction in accordance with the invention shows lower GIDL compared to such predecessor construction. In some DRAM applications with higher $I_{on}$ and keeping $I_{off}$ about the same, one may achieve better write performance and thus tail bit fails may reduce. Similarly, a lower leakage may reduce refresh fails.

Figure 6:
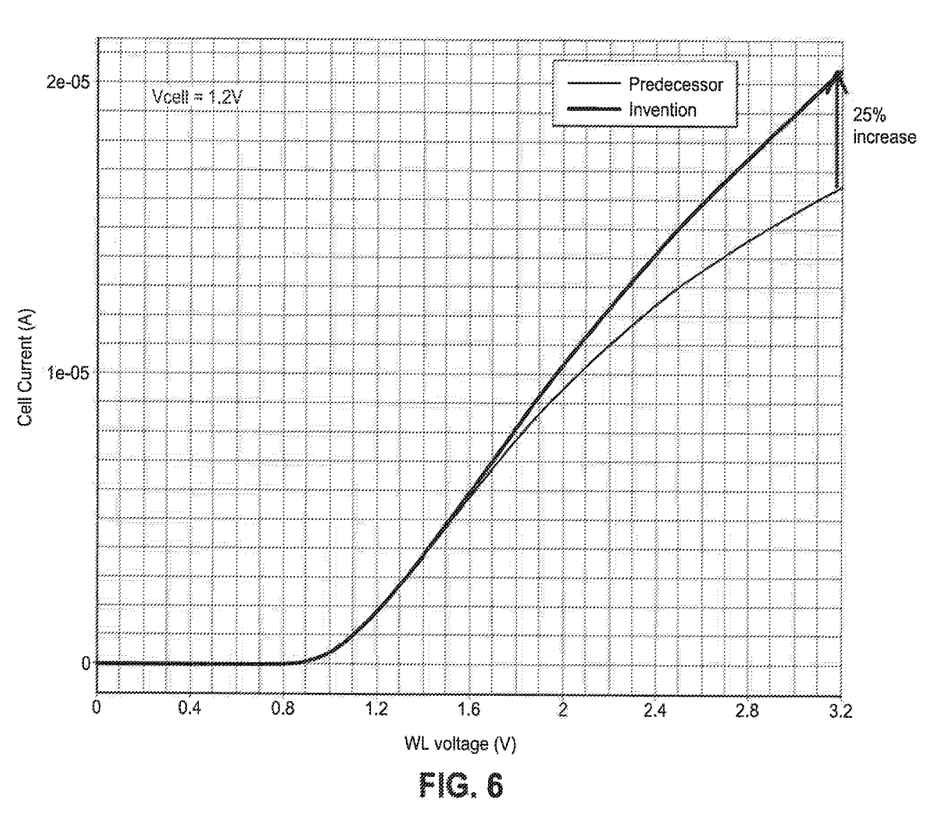
FIG. 6 is a graph comparing operational characteristics of an electronic component in accordance with the invention and the predecessor (non-invention) electronic component.
Figure 7:
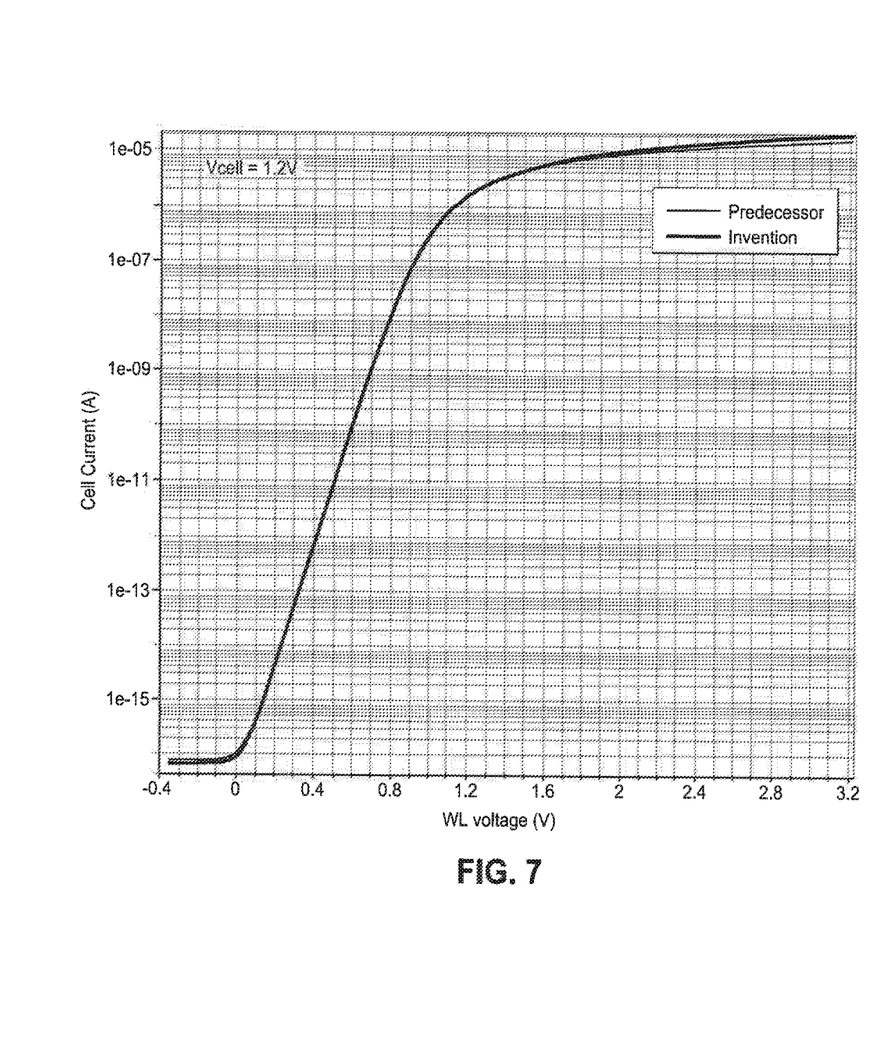
FIG. 7 is a graph comparing operational characteristics of an electronic component in accordance with the invention and the predecessor (non-invention) electronic component.

FIG. 6 compares cell current (voltage differential between terminals 26 and 28 at 1.2 volts) as a function of word-line/gate 22 voltage for such inventive construction and predecessor construction. Such shows about a 25% increase for such an inventive construction over the predecessor construction for gate voltage at 3.2 volts. FIG. 7, for the same voltage differential between terminals 26 and 28 in FIG. 6, shows essentially the same off current ($I_{off}$) when 0 volt is applied to the word-line/gate.

Figure 8:
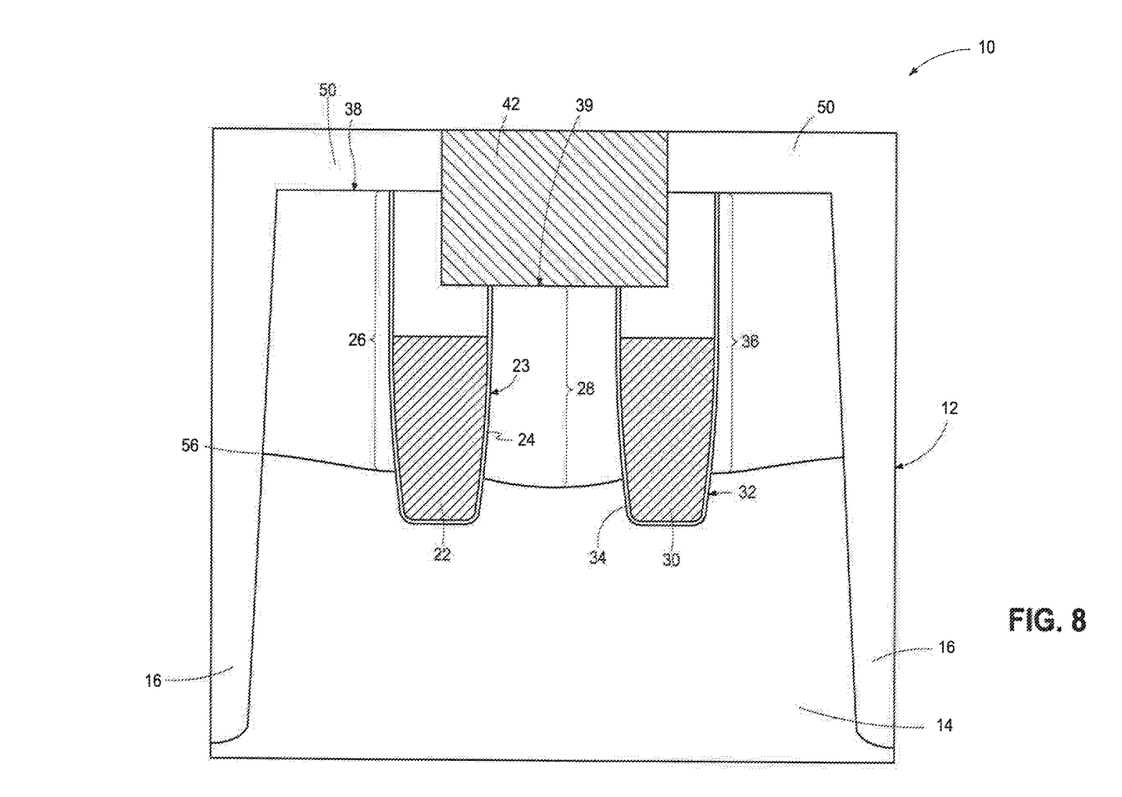
FIG. 8 is a diagrammatic sectional view of a substrate fragment in process in accordance with an embodiment of the invention.

An embodiment of the invention encompasses a method of forming a conductive via to a region of semiconductor material, for example in forming constructions as described above or other constructions. Such an example method embodiment is next described with reference to FIGS. 8-11 in manufacture of a construction such as shown in FIG. 1. Referring to FIG. 8, a predecessor substrate fragment 10 is shown in a process of fabrication prior to forming conductive via 40 of FIG. 1. Conductive via 42 is shown as already having been formed, and its formation and sequence relative to formation of conductive via 40 is not particularly material to the method embodiments of the invention. Insulator material 50 has been formed over and directly against a region 26 of semiconductor material 14.

Figure 9:
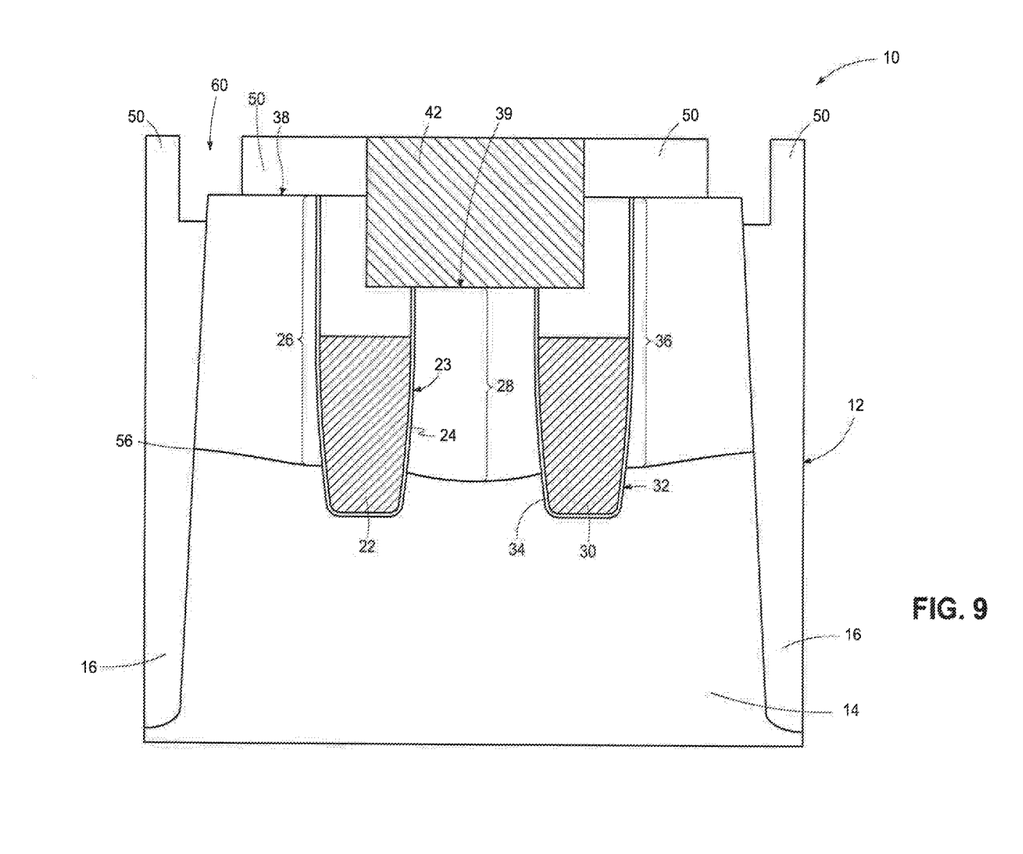
FIG. 9 is a view of the FIG. 8 substrate at a processing step subsequent to that shown by FIG. 8.

Referring to FIG. 9, an opening 60 has been formed through insulator material 50 to semiconductor material region 26. An example technique comprises photolithographic patterning and an etch using a mask, and performing a dry anisotropic etch which may or may not be conducted selectively relative to material of region 26. In this document, a selective etch or removal is an etch or removal where one material is removed relative to another stated material at a rate of at least 1.5:1. Etching in FIG. 9 is shown as having been conducted of insulator material 50 highly selectively relative to semiconductor material region 26.

Figure 10:
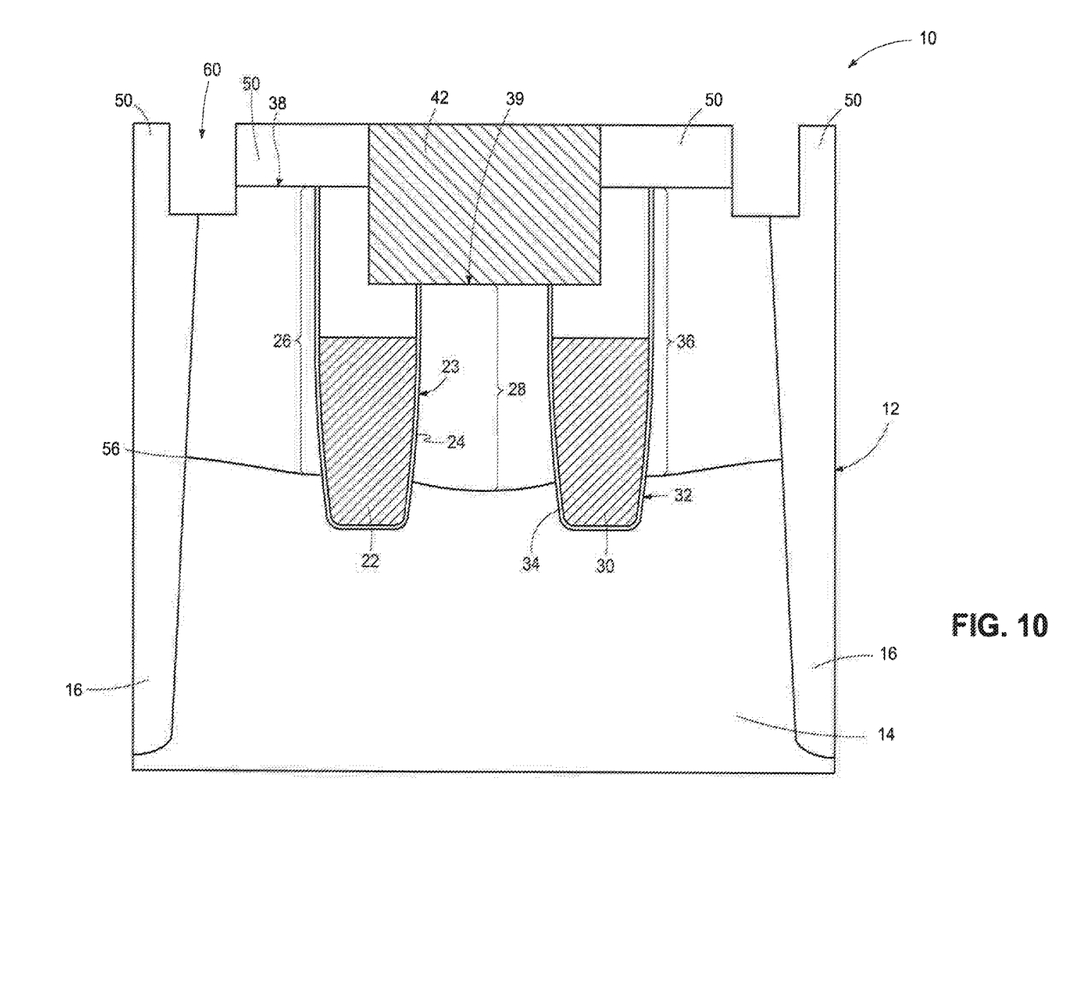
FIG. 10 is a view of the FIG. 9 substrate at a processing step subsequent to that shown by FIG. 9.

Referring to FIG. 10, dry anisotropic etching has been conducted elevationally into semiconductor material of region 26, and in one embodiment as shown highly selectively relative to insulator material 50. Alternately as an example, etching conditions and chemistry may be selected whereby the FIGS. 9 and 10 etchings are conducted in a largely single etching step using a single etching chemistry.

Figure 11:
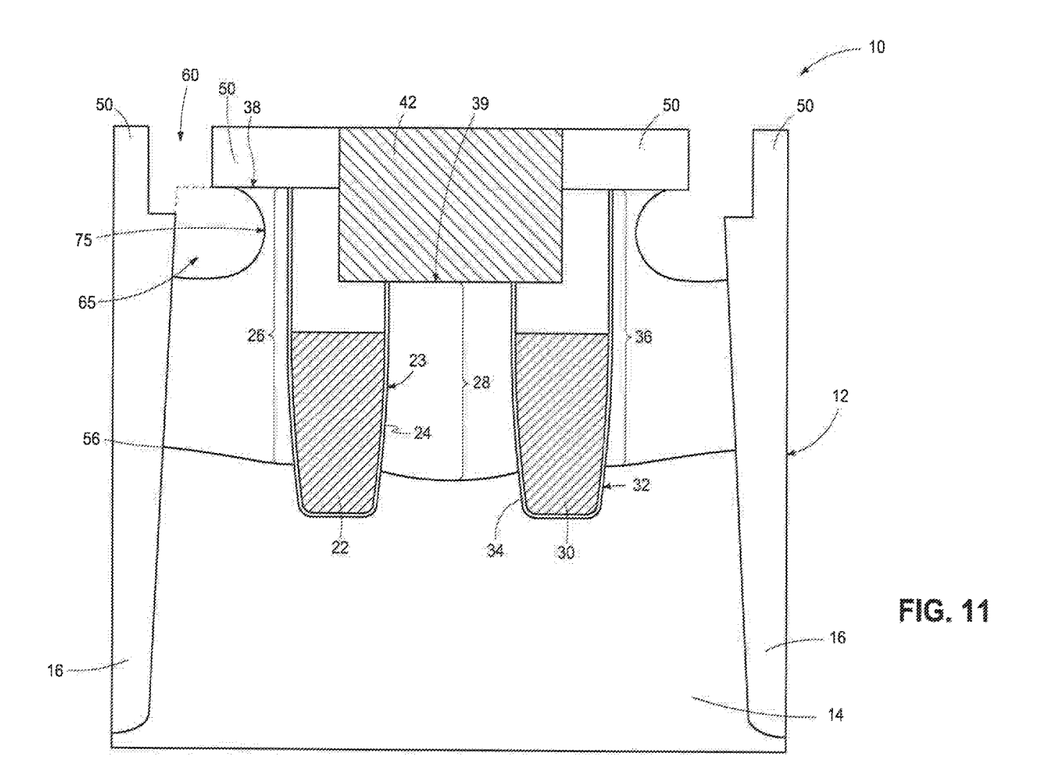
FIG. 11 is a view of the FIG. 10 substrate at a processing step subsequent to that shown by FIG. 10.

Referring to FIG. 11, the processing of FIG. 10 has been followed by isotropic etching into semiconductor material of region 26, forming an opening 65 therein. Alternately as an example, the FIG. 9 substrate may be isotropically etched foregoing an anisotropic etch of region 26 as shown in FIG. 10. Regardless, in one embodiment and as shown, opening 65 has been etched to form a laterally innermost surface 75 in the semiconductor material of region 26 that is curved and concave.

Such provides but some examples of etching semiconductor material of region 26 through opening 60 in insulator material 50 selectively relative to insulator material 50 and forming an opening 65 in region 26 that extends elevationally into region 26 and laterally under insulator material 50.

Opening 65 in region 26 and opening 60 in insulator material 50 would subsequently be filled with conductive material and otherwise processed, for example, to produce a construction as shown in FIG. 1. The artisan will appreciate that etching and processing conditions might be modified to produce any of the constructions identified above. For example and by way of example only, if it is desired that little or no conductive material be formed against surface 38 and/or the underside of insulator material 50, an anisotropically etched sidewall spacer (not shown) could be formed against sidewalls of opening 60 of the FIG. 10 construction prior to conducting an isotropic etch of semiconductor material of region 26. Such spacer(s) could remain or subsequently be removed before forming the conductive via.

CONCLUSION

In some embodiments, a method of forming a conductive via to a region of semiconductor material comprises forming insulator material over a region of semiconductor material. An opening is formed through the insulator material to the region of semiconductor material. Semiconductor material of the region is etched through the opening in the insulator material selectively relative to the insulator material and an opening is formed in the region of semiconductor material that extends elevationally into the region and laterally under the insulator material. The opening in the region and the opening in the insulator material are filled with conductive material.

In some embodiments, an electronic component of integrated circuitry comprises a substrate comprising at least two terminals. Material of one of the terminals has an upper surface. A conductive via extends elevationally into the material of the one terminal. The conductive via extends laterally into the material of the one terminal under the upper surface of the one terminal. Material of the one terminal is above at least some of the laterally extending conductive via.

In some embodiments, an electronic component of integrated circuitry comprises a substrate comprising at least two terminals. Insulator material is above one of the terminals. A conductive via extends elevationally through the insulator material and extends laterally under and directly against an underside surface of the insulator material in a vertical cross-section and elevationally over and directly against an elevationally outermost surface of the one terminal in the vertical cross-section. All of lateral extent of the conductive via that is laterally under the insulator material has an elevationally outermost surface that is directly against the underside surface of the insulator material.

In some embodiments, a recessed access device comprises a conductive gate in a trench in semiconductor material. A gate insulator is along sidewalls and a base of the trench between the conductive gate and the semiconductor material. A pair of source/drain regions is in elevationally outer portions of the semiconductor material on opposing sides of the trench. Insulator material is above and directly against an upper surface of one of the pair of source/drain regions. A conductive via extends elevationally through the insulator material elevationally into the one source/drain region. The one source/drain region has a maximum horizontal width in a vertical cross-section adjacent a bottom of the conductive via. The one source/drain region has a laterally outermost edge in the vertical cross-section. The conductive via extends laterally outward beyond the laterally outermost edge of the one source/drain region in the vertical cross-section. The conductive via extends laterally into the one source/drain region under the insulator material. Material of the one source/drain region is above the laterally extending conductive via. The conductive via in the vertical cross-section has a maximum lateral extent in the one source/drain region that is at least 30% of said maximum horizontal width.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An electronic component of integrated circuitry, comprising:
   a substrate comprising at least two terminals, material of one of the terminals having an upper surface; and
   a conductive via extending elevationally into the material of the one terminal, the conductive via extending laterally into the material of the one terminal under the upper surface of the one terminal, material of the one terminal being above at least some of the laterally extending conductive via, the component being a field effect transistor and the one terminal being a source/drain region.

2. The method of claim 1 wherein the upper surface of the material of the one terminal is the elevationally outermost surface of the material of the one terminal.

3. The electronic component of claim 1 wherein the one terminal has a maximum horizontal width in a vertical cross-section adjacent a bottom of the conductive via, the conductive via in the vertical cross-section having a maximum lateral extent in the material of the one terminal that is at least 30% of said maximum horizontal width.

4. The electronic component of claim 3 wherein said maximum lateral extent is at least 50% of said maximum horizontal width.

5. The electronic component of claim 4 wherein said maximum lateral extent is at least 75% of said maximum horizontal width.

6. The electronic component of claim 5 wherein said maximum lateral extent is 100% of said maximum horizontal width.

7. The electronic component of claim 3 wherein said maximum lateral extent is less than 100% of said maximum horizontal width.

8. The electronic component of claim 1 comprising insulator material above and directly against the upper surface of the one terminal, the conductive via extending elevationally through the insulator material and laterally under the insulator material.

9. The electronic component of claim 8 wherein a lateral portion of the conductive via that is laterally under the insulator material has an elevationally outermost surface that is directly against an underside surface of the insulator material.

10. An electronic component of integrated circuitry, comprising:
    a substrate comprising at least two terminals, material of one of the terminals having an upper surface;

a conductive via extending elevationally into the material of the one terminal, the conductive via extending laterally into the material of the one terminal under the upper surface of the one terminal, material of the one terminal being above at least some of the laterally extending conductive via;

the one terminal having a maximum horizontal width in a vertical cross-section adjacent a bottom of the conductive via, the conductive via in the vertical cross-section having a maximum lateral extent in the material of the one terminal that is at least 30% of said maximum horizontal width, said maximum lateral extent being less than 100% of said maximum horizontal width; and the conductive via having a laterally innermost surface laterally into the material of the one terminal, the laterally innermost surface being convexly curved.

11. An electronic component of integrated circuitry, comprising:

a substrate comprising at least two terminals, material of one of the terminals having an upper surface;

a conductive via extending elevationally into the material of the one terminal, the conductive via extending laterally into the material of the one terminal under the upper surface of the one terminal, material of the one terminal being above at least some of the laterally extending conductive via;

insulator material above and directly against the upper surface of the one terminal, the conductive via extending elevationally through the insulator material and laterally under the insulator material; and none of the conductive via that is laterally under the insulator material being directly against any underside surface of the insulator material.

12. An electronic component of integrated circuitry, comprising:

a substrate comprising at least two terminals, material of one of the terminals having an upper surface; and a conductive via extending elevationally into the material of the one terminal, the conductive via extending laterally into the material of the one terminal under the upper surface of the one terminal, material of the one terminal being above at least some of the laterally extending conductive via, the one terminal having a laterally outermost edge in a vertical cross-section, the conductive via extending laterally outward beyond the laterally outermost edge of the one terminal in the vertical cross-section.

13. An electronic component of integrated circuitry, comprising:

a substrate comprising at least two terminals;

insulator material above one of the terminals; and a conductive via extending elevationally through the insulator material and extending laterally under and directly against an underside surface of the insulator material in a vertical cross-section and elevationally over and directly against an elevationally outermost surface of the one terminal in the vertical cross-section, all of lateral extent of the conductive via that is laterally under the insulator material having an elevationally outermost surface that is directly against the underside surface of the insulator material.

14. An electronic component of integrated circuitry, comprising:

a substrate comprising at least two terminals;

insulator material above one of the terminals; and a conductive via extending elevationally through the insulator material and extending laterally under and directly against an underside surface of the insulator material in a vertical cross-section and elevationally over and directly against an elevationally outermost surface of the one terminal in the vertical cross-section, all of lateral extent of the conductive via that is laterally under the insulator material having an elevationally outermost surface that is directly against the underside surface of the insulator material, the one terminal having a laterally outermost edge in the vertical cross-section, the conductive via extending laterally outward beyond the laterally outermost edge of the one terminal in the vertical cross-section.

15. A recessed access device comprising:

a conductive gate in a trench in semiconductor material;

a gate insulator along sidewalls and a base of the trench between the conductive gate and the semiconductor material;

a pair of source/drain regions in elevationally outer portions of the semiconductor material on opposing sides of the trench;

insulator material above and directly against an upper surface of one of the pair of source/drain regions; and a conductive via extending elevationally through the insulator material elevationally into the one source/drain region, the one source/drain region having a maximum horizontal width in a vertical cross-section adjacent a bottom of the conductive via, the one source/drain region having a laterally outermost edge in the vertical cross-section, the conductive via extending laterally outward beyond the laterally outermost edge of the one source/drain region in the vertical cross-section, the conductive via extending laterally into the one source/drain region under the insulator material, material of the one source/drain region being above the laterally extending conductive via, the conductive via in the vertical cross-section having a maximum lateral extent in the one source/drain region that is at least 30% of said maximum horizontal width.

* * * * *